(12) United States Patent
Chao et al.

(10) Patent No.: US 7,655,980 B1
(45) Date of Patent: Feb. 2, 2010

(54) DEVICE FOR ESD PROTECTION CIRCUIT

(75) Inventors: Mei-Ling Chao, Hsinchu (TW);
Chia-Yun Chen, Tainan (TW);
Tai-Hsiang Lai, Miaoli County (TW);
Tien-Hao Tang, Hsinchu (TW)

(73) Assignee: United Microelectronics Corp.,
Hsinchu (TW)

( * ) Notice: Subject to any disclaimer, the term of this patent is extended or adjusted under 35 U.S.C. 154(b) by 48 days.

(21) Appl. No.: 12/178,058

(22) Filed: Jul. 23, 2008

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............. 257/335; 257/336; 257/E29.256
(58) Field of Classification Search ......... 257/328, 257/335–338, E29.256, E29.261
See application file for complete search history.

(56) References Cited

U.S. PATENT DOCUMENTS

| | | |
|---|---|---|
| 6,444,511 B1 | 9/2002 | Wu et al. |
| 6,838,734 B2 | 1/2005 | Ker et al. |
| 6,979,875 B2 * | 12/2005 | Kwon et al. ............ 257/492 |
| 7,135,743 B2 | 11/2006 | Manna et al. |

\* cited by examiner

*Primary Examiner*—Thien F Tran
(74) *Attorney, Agent, or Firm*—J.C. Patents

(57) ABSTRACT

A LDNMOS device for an ESD protection circuit including a P-type substrate and an N-type deep well region is provided. The P-type substrate includes a first area and a second area. The N-type deep well region is in the first and second areas of the P-type substrate. The LDNMOS device further includes a gate electrode disposed on the P-type substrate between the first and second areas, a P-type implanted region disposed in the first area of the P-type substrate, an N-type grade region disposed in the N-type deep well region of the first area, an N-type first doped region disposed in the N-type grade region, a P-type body region disposed in the N-type deep well region of the second area, an N-type second doped region disposed in the P-type body region, and a P-type doped region disposed in the P-type body region and adjacent to the N-type second doped region.

15 Claims, 6 Drawing Sheets

DEVICE FOR ESD PROTECTION CIRCUIT

BACKGROUND OF THE INVENTION

1. Field of Invention

The present invention relates to a semiconductor device, and more particularly to a lateral diffused metal oxide semiconductor (LDMOS) device for an electrostatic discharge (ESD) protection circuit.

2. Description of Related Art

ESD is the main factor of electrical overstress (EOS) which causes damage to most of electronic devices or systems. Such damage can result in the permanent damage of semiconductor devices and computer systems, so that the circuit function of ICs is affected and the operation of electronic products is abnormal.

In a deep submicron semiconductor process, the ESD tolerance is getting worse as dimensions of devices are getting smaller. Hence, the design for ESD protection has been taken into account when designing ICs. Usually the ESD tolerance for commercially available ICs is required to pass the human body mode (HBM) test at 2 kV and the machine model (MM) test at 200 V.

In order to sustain the above-mentioned high-voltage ESD tests, the large-sized ESD protection device for ICs is usually applied. This large-sized device is designed as a multi-finger shape in the layout to save the chip area as much as possible.

However, for the frequently used LDMOS device in power management, at the moment, the multi-finger LDMOS device still cannot pass the HBM test at 2 kV and the MM test at 200 V. Therefore, a LDMOS device having enough ESD tolerance is deeply desired for an ESD protection circuit.

SUMMARY OF THE INVENTION

The present invention provides a LDMOS device having a higher ESD tolerance.

The present invention provides a device for an ESD protection circuit, and the device includes at least one LDMOS device. The LDMOS device includes a substrate of a first conductivity type and a deep well region of a second conductivity type. The substrate includes a first area and a second area. The deep well region is disposed in the first and second areas of the substrate. The LDMOS device further includes a gate electrode, an implanted region of the first conductivity type, a grade region of the second conductivity type, a first doped region of the second conductivity type, a body region of the first conductivity type, a second doped region of the second conductivity type, and a doped region of the first conductivity type. The gate electrode is disposed on the substrate between the first and second areas. The implanted region is disposed in the first area of the substrate. The grade region is disposed in the deep well region of the first area. The first doped region is disposed in the grade region. The body region is disposed in the deep well region of the second area. The second doped region is disposed in the body region. The doped region is disposed in the body region and adjacent to the second doped region.

According to an embodiment of the present invention, the implanted region is disposed between the first doped region and the grade region.

According to an embodiment of the present invention, the implanted region is disposed below the first doped region.

According to an embodiment of the present invention, the implanted region is disposed in the grade region.

According to an embodiment of the present invention, the implanted region is disposed between the grade region and the deep well region.

According to an embodiment of the present invention, the implanted region is disposed in the deep well region.

According to an embodiment of the present invention, the first conductivity type is P-type and the second conductivity is N-type.

According to an embodiment of the present invention, the first conductivity type is N-type and the second conductivity is P-type.

According to an embodiment of the present invention, the LDMOS device further includes a lightly doped region of the second conductivity type. The lightly doped region is disposed in the body region between the gate electrode and the second doped region.

According to an embodiment of the present invention, the LDMOS device further includes a well region of the first conductivity type and a guard ring. The well region is disposed outside the deep well region. The guard ring is disposed in the well region.

According to an embodiment of the present invention, the LDMOS device further includes an isolation structure. The isolation structure is disposed between the second doped region and the guard ring.

According to an embodiment of the present invention, the isolation structure includes a FOX structure or a STI structure.

According to an embodiment of the present invention, the device for an ESD protection circuit includes a plurality of the LDMOS devices.

According to an embodiment of the present invention, a plurality of the gate electrodes of the LDMOS devices is connected to each other.

According to an embodiment of the present invention, the gate electrodes are connected to form a multi-finger shape.

In the LDMOS device for an ESD protection circuit of the present invention, an implanted region is formed below the drain region, so that the ESD tolerance is significantly enhanced.

In order to make the aforementioned and other objects, features and advantages of the present invention comprehensible, a preferred embodiment accompanied with figures is described in detail below.

DESCRIPTION OF EMBODIMENTS

In the present invention, a LDMOS device for an ESD protection circuit can be a LDNMOS device or a LDPMOS device. In the following embodiments, a LDNMOS device in which the first conductivity type is P-type and the second conductivity type is N-type is provided for illustration purposes, and is not to be construed as limiting the scope of the present invention. It is appreciated by persons skilled in the art that the first conductivity type can be N-type and the second conductivity type can be P-type so as to form a LDPMOS device.

A device for an ESD protection circuit including two LDNMOS devices is provided for illustration purposes, and is not to be construed as limiting the present invention. The number of the LDMOS devices for the ESD protection circuit is not limited by the present invention.

Figure 1:
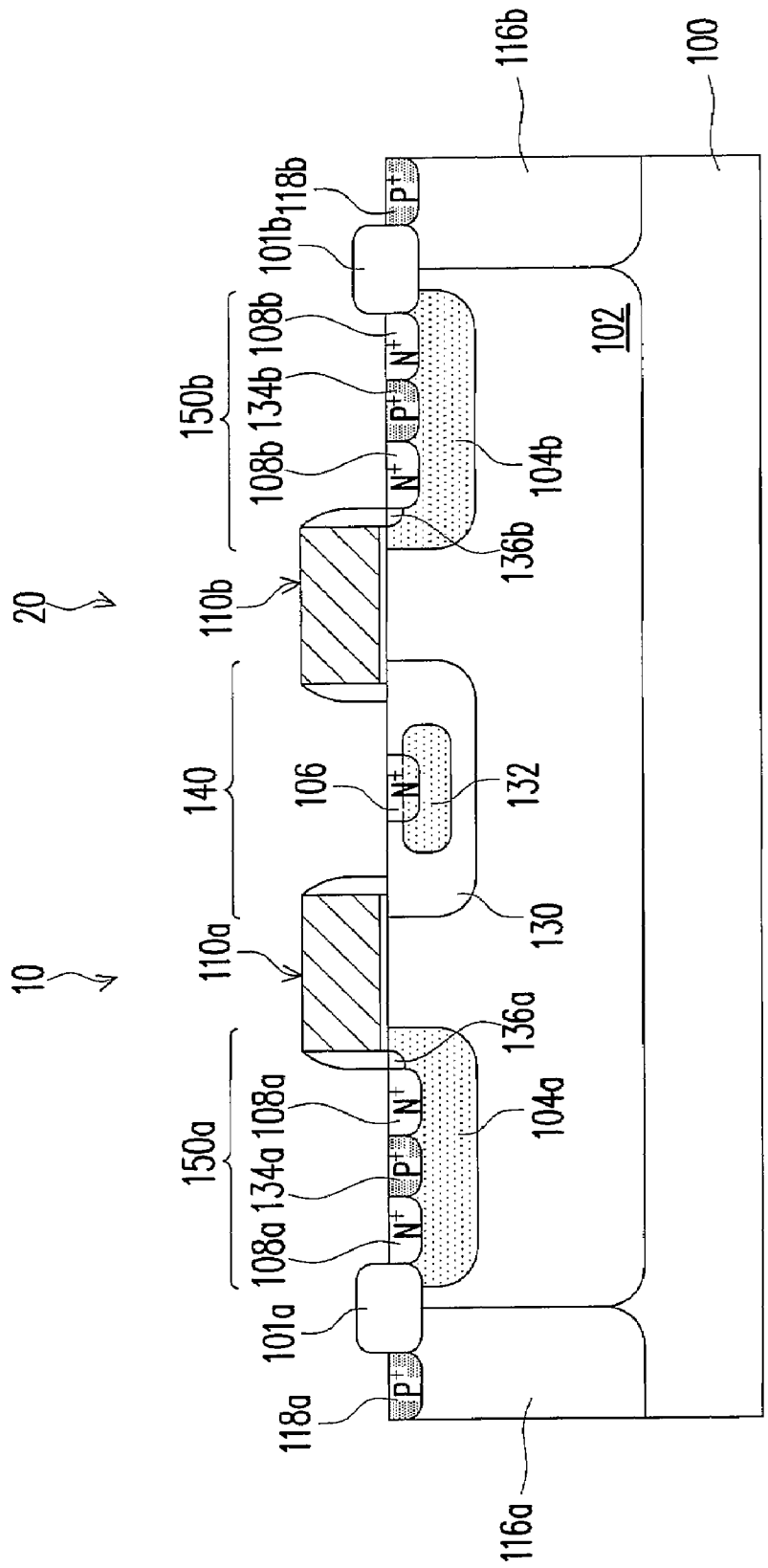
FIG. 1 schematically illustrates a cross-section view of a LDNMOS device for an ESD protection circuit according to an embodiment of the present invention.

FIG. 1 schematically illustrates a cross-section view of a LDNMOS device for an ESD protection circuit according to an embodiment of the present invention.

Referring to FIG. 1, the LDNMOS devices 10 and 20 for an ESD protection circuit (ESD LDNMOS devices 10 and 20) includes a P-type substrate 100 and an N-type deep well region 102. The P-type substrate 100 includes a first area 140 and second areas 150a and 150b. The first area 140 is disposed between second areas 150a and 150b. The N-type deep well region 102 is disposed in the first area 140 and the second areas 150a and 150b of the substrate 100. In an embodiment, the energy of implantation for forming the N-type deep well region 102 is about 1600-2000 KeV, and the dosage of the same is about $10^{11}$-$3 \times 10^{12}$/cm$^2$, for example.

The ESD LDNMOS device 10 further includes a gate electrode 110a, an N-type first doped region 106, an N-type grade region 130, two N-type second doped regions 108a, a P-type doped region 134a and a P-type body region 104a. The ESD LDNMOS device 20 further includes a gate electrode 110b, an N-type first doped region 106, an N-type grade region 130, two N-type second doped regions 108b, a P-type doped region 134b and a P-type body region 104b.

The N-type grade region 130 is disposed in the deep well region 102 of the first area 140. In an embodiment, the energy of implantation for forming the N-type grade region 130 is about 50-150 KeV, and the dosage of the same is about $10^{11}$-$5 \times 10^{12}$/cm$^2$, for example.

The N-type first doped region 106 may be an N+ doped region disposed in the grade region 130 of the same conductivity. The N-type first doped region 106 is the common drain region of the ESD LDNMOS devices 10 and 20. The N-type first doped region 106 is electronically connected to the pad via a contact plug. In an embodiment, the energy of implantation for forming the N-type first doped region 106 is about 60-100 KeV, and the dosage of the same is about $10^{14}$-$2 \times 10^{15}$/cm$^2$, for example.

The P-type body regions 104a and 104b are respectively disposed in the deep well region 102 of the second areas 150a and 150b. In an embodiment, the energy of implantation for forming the P-type body regions 104a and 104b is about 160-200 KeV, and the dosage of the same is about $10^{12}$-$4 \times 10^{13}$/cm$^2$, for example.

The N-type second doped regions 108a and 108b, such as N+ doped regions, are respectively disposed in the P-type body regions 104a and 104b. The N-type second doped regions 108a and 108b are source regions respectively for the ESD LDNMOS devices 10 and 20. In an embodiment, the energy of implantation for forming the N-type second doped regions is about 60-100 KeV, and the dosage of the same is about $10^{14}$-$2 \times 10^{15}$/cm$^2$, for example.

The P-type doped regions 134a and 134b, such as P+ doped regions, are respectively disposed in the P-type body regions 104a and 104b. The P-type doped region 134a is disposed between the two N-type second doped regions 108a. The P-type doped region 134b is disposed between the two N-type second doped regions 108b. In an embodiment, the energy of implantation for forming the P-type doped regions 134a and 134b is about 35-75 KeV, and the dosage of the same is about $10^{14}$-$3 \times 10^{15}$/cm$^2$, for example. The P-type doped region 134a and the N-type second doped regions 108a are electronically connected to the source line via a contact plug. Similarly, the P-type doped region 134b and the N-type second doped regions 108b are electronically connected to the source line via a contact plug.

Figure 1A:
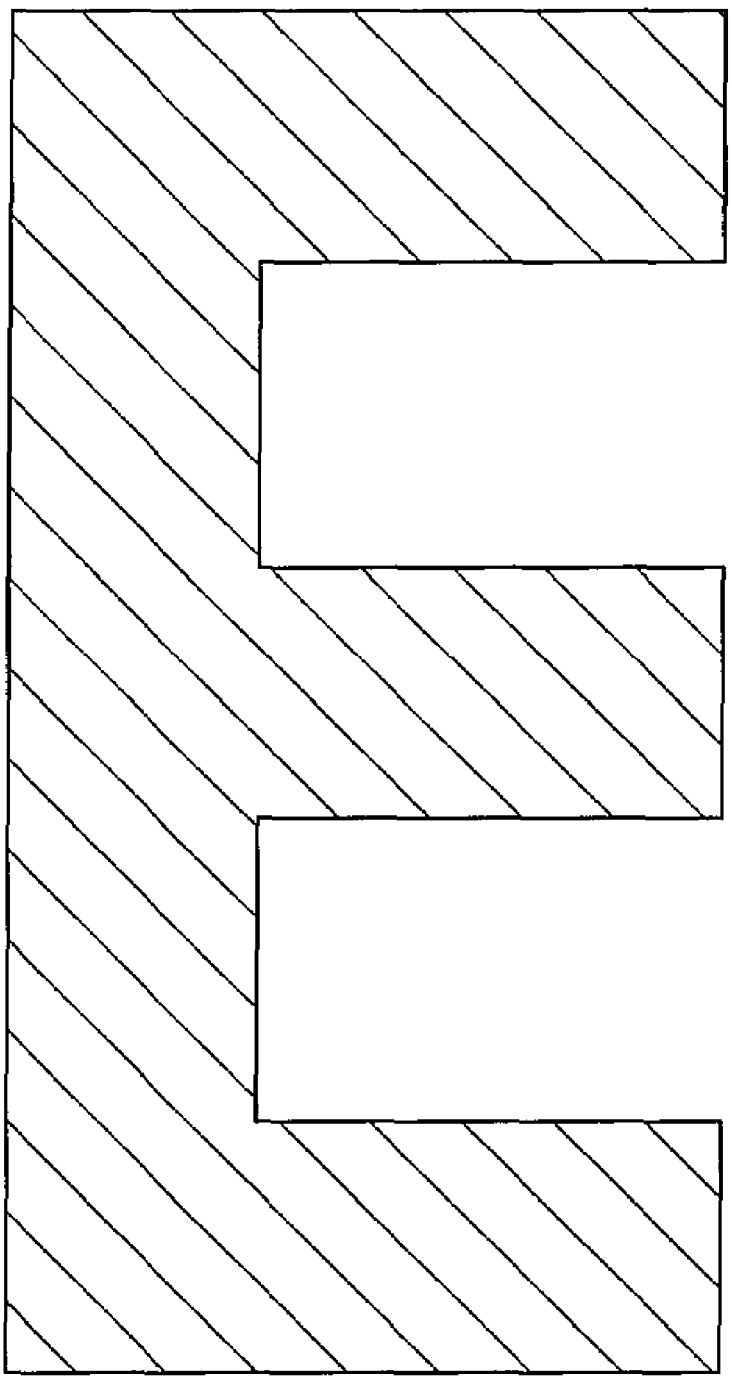
FIG. 1A schematically illustrates a top view of a LDNMOS device for an ESD protection circuit according to an embodiment of the present invention.

The gate electrode 110a is disposed on the deep well region 102 between the first area 140 and the second area 150a, extending over the N-type grade region 130 of the first area 140 and a portion of the P-type body region 104a of the second area 150a. The gate electrode 110b is disposed on the deep well region 102 between the first area 140 and the second area 150b, extending over the N-type grade region 130 of the first area 140 and a portion of the P-type body region 104b of the second area 150b. The gate electrodes 110a and 110b include a gate conductive layer and a gate dielectric layer. Spacers are formed beside the gate conductive layer and the gate dielectric layer. In an embodiment, the gate electrodes 110a and 110b are connected to each other to form a two-finger shape. It is for sure that the device for an ESD protection circuit can include a plurality of LDNMOS devices, and a plurality of gate electrodes of the LDNMOS devices is connected to one another to form a multi-finger shape, as shown in FIG. 1A.

In an embodiment, the ESD LDNMOS devices 10 and 20 further respectively include N-type lightly doped regions 136a and 136b. The N-type lightly doped region 136a is disposed between the gate electrode 110a and the N-type second doped region 108a. The N-type lightly doped region 136b is disposed between the gate electrode 110b and the N-type second doped region 108b.

The ESD LDNMOS devices 10 and 20 can further include P-type well regions 116a and 116b and guard rings 118a and 118b. The P-type well regions 116a and 116b are respectively disposed outside the N-type deep well region 102. The guard rings 118a and 118b are respectively disposed in the P-type well regions 116a and 116b. In an embodiment, an isolation structure 101a is disposed between the guard ring 118a and the N-type second doped region 108a, and an isolation structure 101b is disposed between the guard ring 118b and the N-type second doped region 108b. The isolation structures 101a and 101b can be shallow trench isolation (STI) structures or a field oxide (FOX) structures.

In this invention, it is noted that the ESD LDNMOS devices 10 and 20 further include a P-type implanted region 132 disposed in the first area 140 of the substrate 100. The dopant of the P-type implanted region 132 includes boron, for example. The area of the P-type implanted region 132 is greater than that of the N-type first doped region 106 but less than that of the N-type grade region 130. The P-type implanted region 132 can be integrated with the current CDMOS process; that is, the P-type implanted region 132 can be formed by forming the implantation mask and performing the ion implantation. The timing of forming the P-type implanted region 132 is not limited. The implantation depth of the P-type implanted region 132 is related to the energy of implantation, and the energy of implantation is between about 10 and 250 KeV. In an embodiment, the implantation dosage of the N-type implanted region 132 is about 0.5-1.5 times that of the N-type grade region 132. In another embodiment, the implantation dosage of the N-type implanted region 132 is about 0.7-1.3 times that of the N-type grade region 132. In yet another embodiment, the implantation dosage of the N-type implanted region 132 is about 0.9-1.1 times that of the N-type grade region 132.

Referring to FIG. 1, in an embodiment, the P-type implanted region 132 is disposed between the N-type first doped region 106 and the N-type grade region 130. The energy of implantation for forming the P-type implanted region 132 is about 10-15 KeV, and the dosage of the same is about $2\times10^{13}$-$8\times10^{13}$/cm$^2$, for example.

Figure 2:
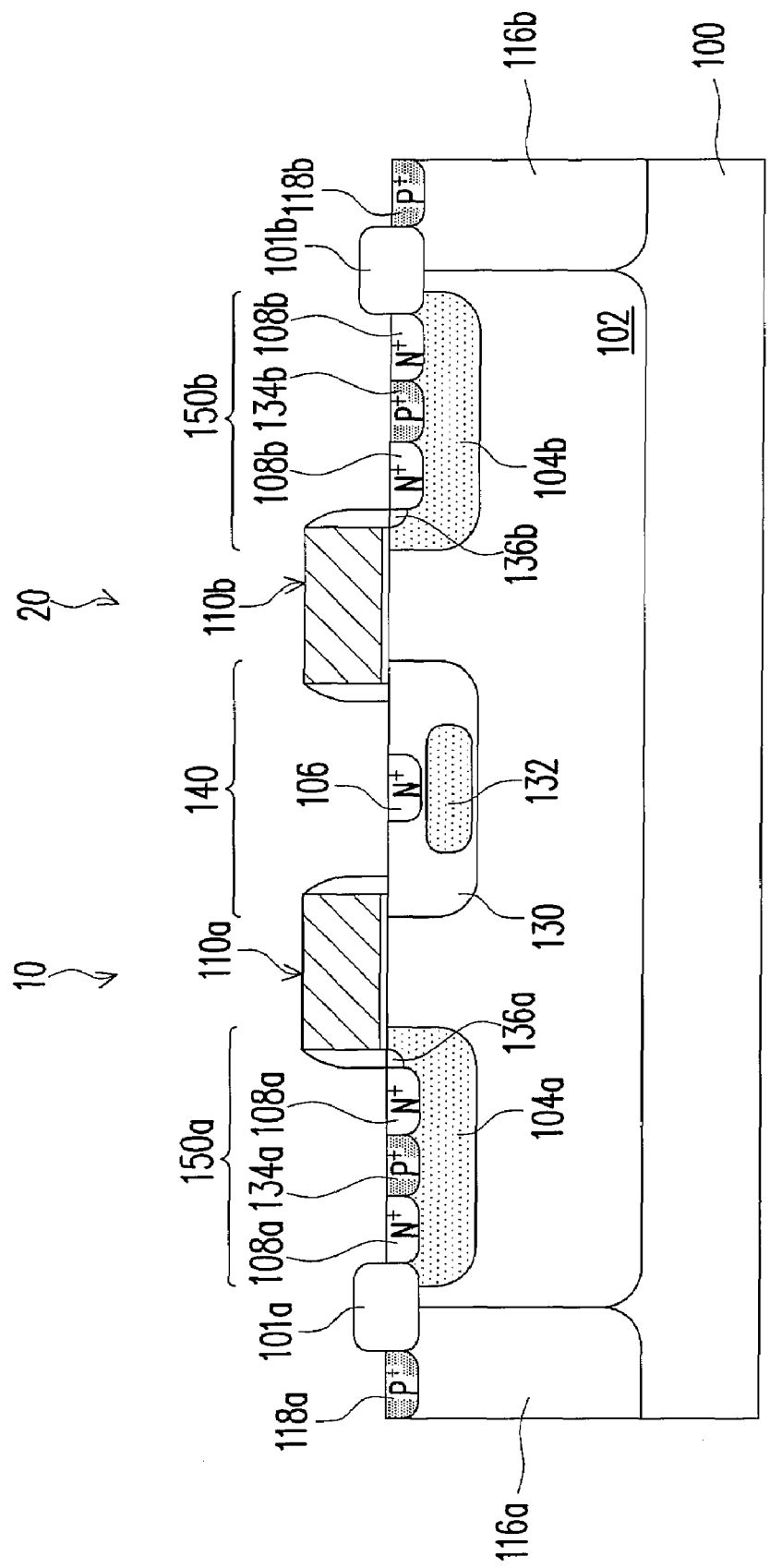
FIG. 2 schematically illustrates a cross-section view of a LDNMOS device for an ESD protection circuit according to another embodiment of the present invention.

Referring to FIG. 2, in another embodiment, the P-type implanted region 132 is disposed in the N-type grade region 130. The energy of implantation for forming the P-type implanted region 132 is about 15-25 KeV, and the dosage of the same is about $2\times10^{13}$-$8\times10^{13}$/cm$^2$, for example.

Figure 3:
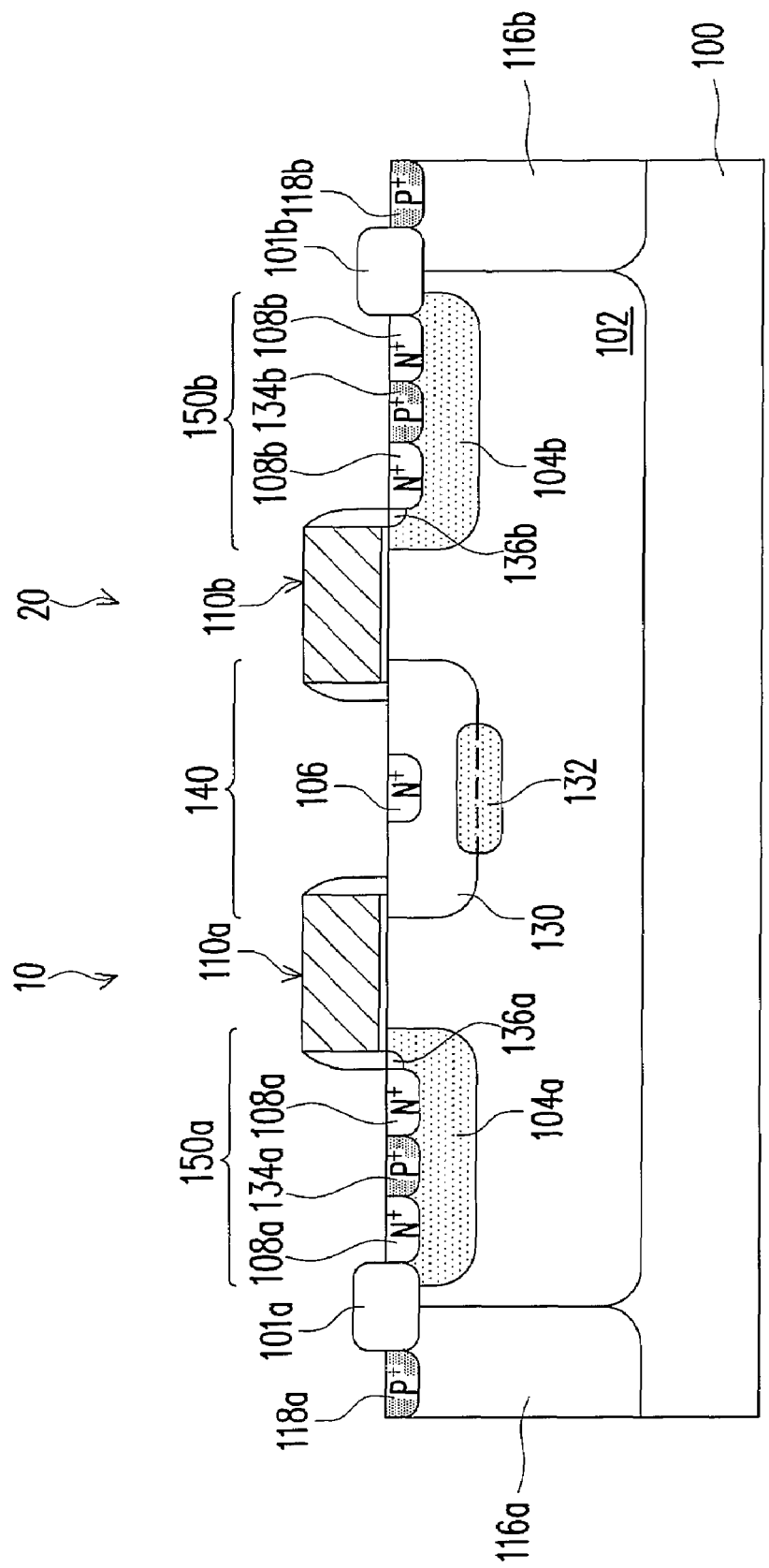
FIG. 3 schematically illustrates a cross-section view of a LDNMOS device for an ESD protection circuit according to yet another embodiment of the present invention.

Referring to FIG. 3, in yet another embodiment, the P-type implanted region 132 is disposed between the N-type grade region 130 and the N-type deep well region 102. The energy of implantation for forming the P-type implanted region 132 is about 25-35 KeV, and the dosage of the same is about $2\times10^{13}$-$8\times10^{13}$/cm$^2$, for example.

Figure 4:
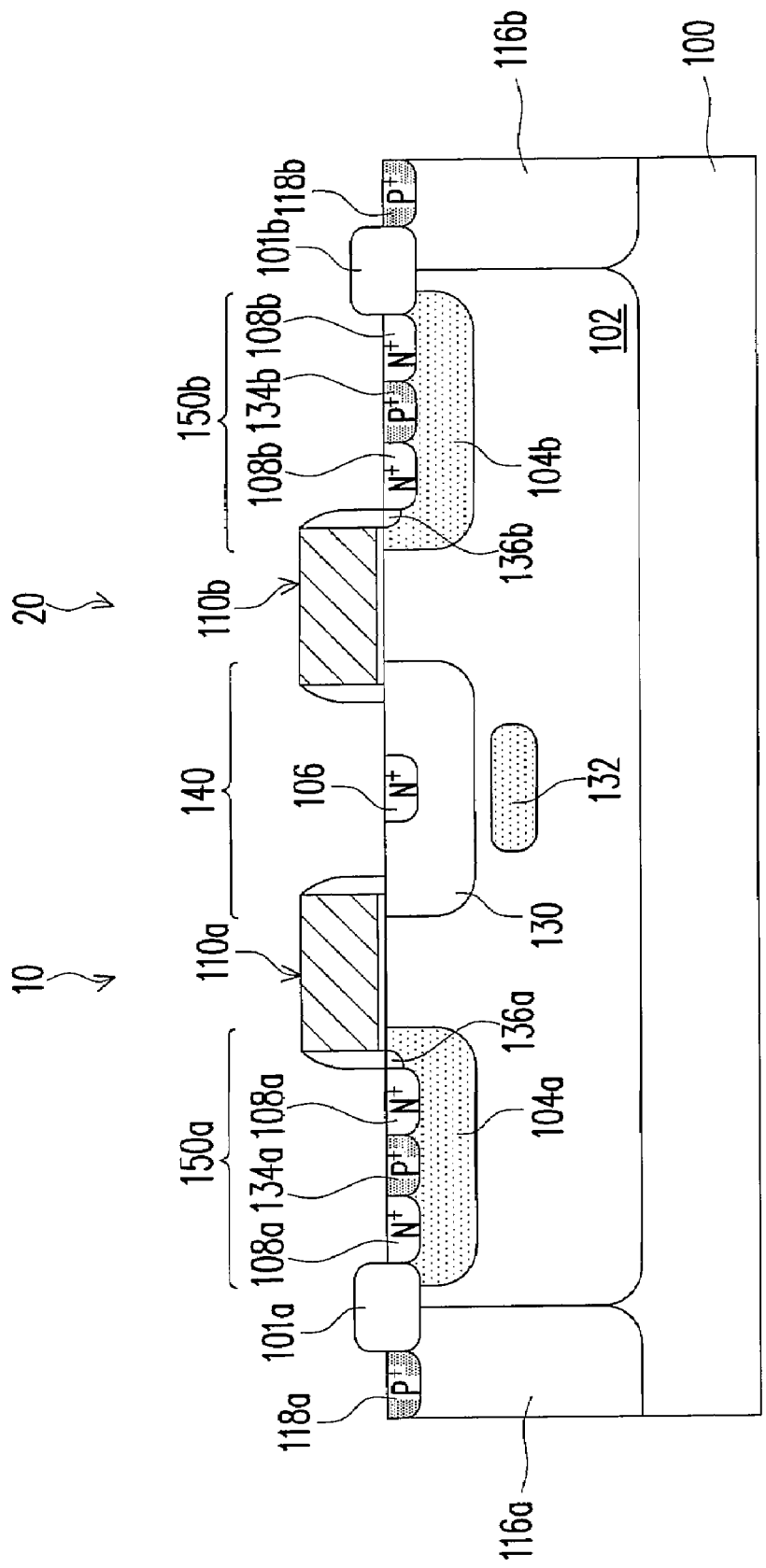
FIG. 4 schematically illustrates a cross-section view of a LDNMOS device for an ESD protection circuit according to still another embodiment of the present invention.

Referring to FIG. 4, in still another embodiment, the N-type implanted region 132 is disposed in the N-type deep well region 102. The energy of implantation for forming the P-type implanted region 132 is about 100-200 KeV, and the dosage of the same is about $2\times10^{13}$-$8\times10^{13}$/cm$^2$, for example.

In the ESD LDNMOS device 10 of FIG. 4, when the applied ESD voltage is greater than the breakdown voltage of junctions between the N-type deep well region 102, the P-type body region 104a and the P-type implanted region 132, the hole and electron currents are generated through the avalanche breakdown mechanism. The hole current flows through the P-type body region 104a and reaches the P-type doped region 134a connected to the source line, so that the voltage levels of the P-type body region 104a and the P-type implanted region 132 are increased. In details, the lateral npn bipolar junction transistor (BJT) including the N-type deep well region 102, the P-type body region 104a and the N-type second doped region 108a is triggered on when the voltage drop across the P-type body region 104a is greater than the cut-in voltage of the lateral npn BJT. When the lateral npn BJT is turned on, the hole current is injected to the P-type doped region 134a via the P-type implanted region 132, so as to increase the voltage level of the P-type implanted region 132. Thereafter, when the injected hole current is greater than a critical value, the vertical npn BJT including the N-type first doped region 106, the P-type implanted region 132 and the N-type deep well region 102 is turned on. Once the lateral npn BJT and the vertical npn BJT are turned on simultaneously, the low impedance path including the N-type first doped region 106, the P-type implanted region 132, the N-type deep well region 102 and the P-type doped region 134a is formed to effectively release the ESD current.

Similarly, referring to FIGS. 1 to 3, the P-type implanted region 132 disposed between the N-type first doped region 106 and the N-type grade region 130 (FIG. 1), the P-type implanted region 132 disposed in the N-type grade region 130 (FIG. 2), or the P-type implanted region 132 disposed between the N-type grade region 130 and the N-type deep well region 102 (FIG. 3) forms a vertical npn BJT with the N-type first doped region 106 and the N-type deep well region 102. Further, the vertical npn BJT forms a low impedance path for effectively releasing the ESD current with the lateral npn BJT including the N-type deep well region 102, the P-type body region 104a and the N-type second doped region 108a.

In the above-mentioned embodiments, a single P-type implanted region 132 disposed right below the N-type first doped region 106 is provided for illustration purposes and is not to be construed as limiting the present invention. It is appreciated by persons skilled in the art that the P-type implanted region 132 can include a plurality of separate small regions. For example, the P-type implanted region 132 may include a plurality of small regions disposed parallel to the surface of the substrate, or disposed in the vertical arrangement. The P-type implanted region 132 can also be optionally disposed in two, three or all of the four regions shown in FIGS. 1 to 4 at the same time.

The P-type implanted region 132 is not limited to be disposed right below the N-type first doped region 106. In other words, the P-type implanted region 132 can be slightly shifted from right below the N-type first doped region 106 and close to the gate electrodes 110a and 110b. Further, the dopant concentration of the P-type implanted region 132 is not limited to be a uniform distribution; that is, a gradient distribution is allowable.

Figure 5:
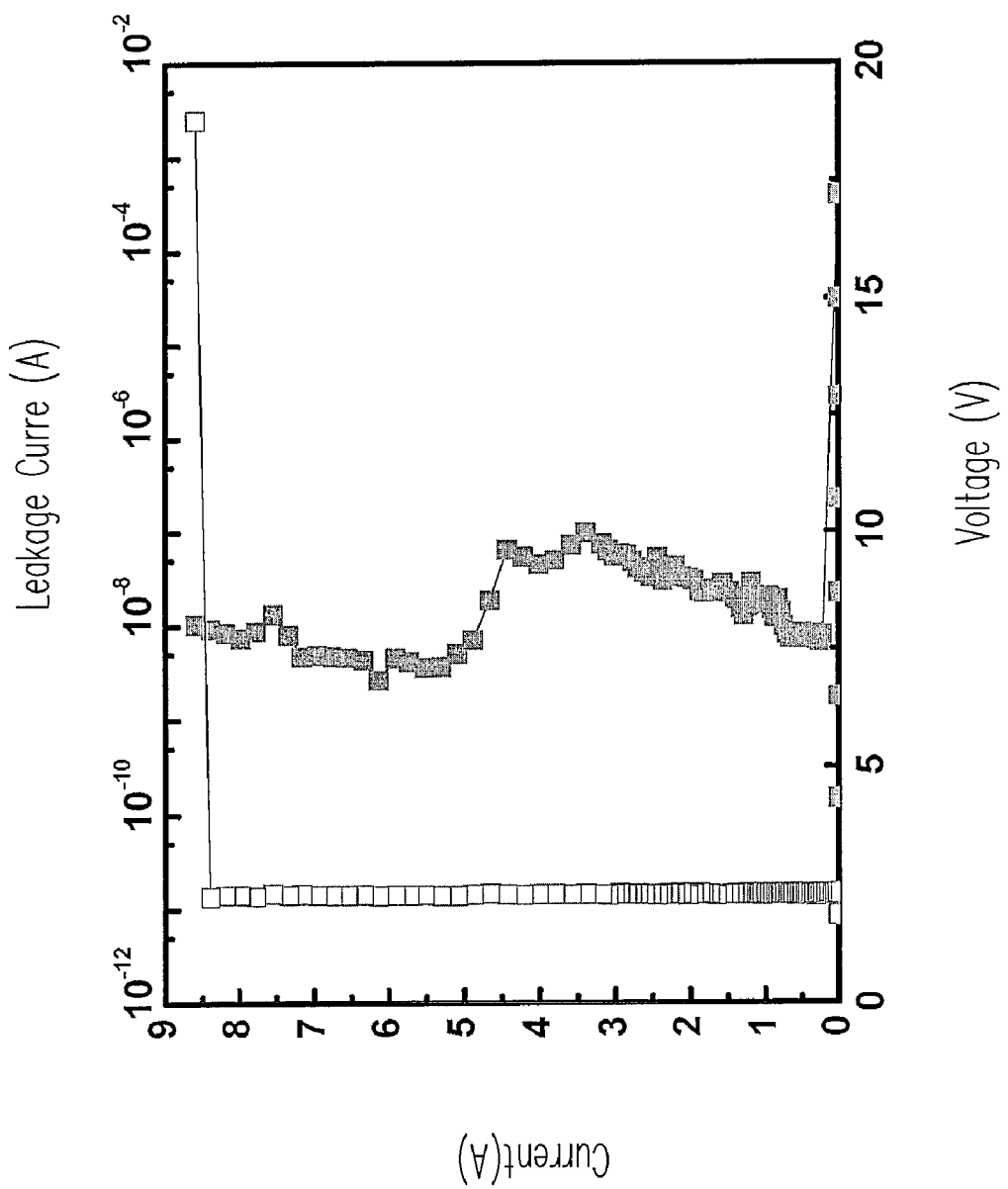
FIG. 5 illustrates the electrical relation diagram upon measurement before the ESD LDNMOS device of the example is packaged.

The example is a 18V ESD LDNMOS device of the present invention. FIG. 5 illustrates the electrical relation diagram upon measurement before the ESD LDNMOS device of the example is packaged. Table 1 and Table 2 are respectively the testing results of the HBM and MM tests after the ESD LDNMOS device of the example and the conventional device are packaged.

TABLE 1

| | HBM test (KV) | | | | | |
|---|---|---|---|---|---|---|
| HBM | | Reverse | | | | |
| test (KV) | Chip 1 | Chip 2 | Chip 3 | Chip 4 | Chip 5 | Forward Chip 6 |
| Conventional device | 1 | 1.2 | 1.8 | 1.8 | 1.8 | >−8 |
| Example | >8 | >8 | >8 | >8 | >8 | >−8 |

TABLE 2

| | MM test (KV) | | | | | |
|---|---|---|---|---|---|---|
| MM | | Reverse | | | Forward | |
| test (V) | Chip 1 | Chip 2 | Chip 3 | Chip 4 | Chip 5 | Chip 6 |
| Conventional device | 125 | 200 | 150 | 125 | −275 | −825 | −750 |
| Example | >800 | >800 | >800 | >800 | −750 | −750 | −800 |

Referring to FIG. 5, the ESD LDNMOS device of the example can sustain the current of more than 8 A, and the trigger voltage thereof is about 23 V.

Referring to Tables 1 and 2, the testing results of the HBM test of the example is greater than 8.0 KV, and those of the MM test is greater than 800 V.

In summary, in the ESD LDMOS device of the present invention, an implanted region having a different conductivity from the drain region is disposed below the drain region, so that the ESD protection ability is enhanced, and the ESD tolerance request for commercially available ICs to pass the HBM test at 2 kV and the MM test at 200 V is easily achieved.

Further, the ESD LDMOS device of the present invention can be applicable to all power management ICs. The process is simple and can be integrated with the current CDMOS process. In addition, the ESD LDMOS device of the present invention is very competitive because the fabrication cost is low.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A device for an ESD protection circuit, comprising at least one LDMOS device, wherein the LDMOS device comprises:
   a substrate of a first conductivity type, comprising a first area and a second area;
   a deep well region of a second conductivity type, disposed in the first area and the second area of the substrate;
   a gate electrode, disposed on the substrate between the first area and the second area;
   an implanted region of the first conductivity type, disposed in the first area of the substrate;
   a grade region of the second conductivity type, disposed in the deep well region of the first area;
   a first doped region of the second conductivity type, disposed in the grade region;
   a body region of the first conductivity type, disposed in the deep well region of the second area;
   a second doped region of the second conductivity type, disposed in the body region; and
   a doped region of the first conductivity type, disposed in the body region and adjacent to the second doped region.

2. The device of claim 1, wherein the implanted region is disposed between the first doped region and the grade region.

3. The device of claim 1, wherein the implanted region is disposed below the first doped region.

4. The device of claim 1, wherein the implanted region is disposed in the grade region.

5. The device of claim 1, wherein the implanted region is disposed between the grade region and the deep well region.

6. The device of claim 1, wherein the implanted region is disposed in the deep well region.

7. The device of claim 1, wherein the first conductivity type is P-type and the second conductivity is N-type.

8. The device of claim 1, wherein the first conductivity type is N-type and the second conductivity is P-type.

9. The device of claim 1, further comprising a lightly doped region of the second conductivity type, disposed in the body region between the gate electrode and the second doped region.

10. The device of claim 1, further comprising:
    a well region of the first conductivity type, disposed outside the deep well region; and
    a guard ring, disposed in the well region.

11. The device of claim 10, further comprising an isolation structure, disposed between the second doped region and the guard ring.

12. The device of claim 11, wherein the isolation structure comprises a FOX structure or a STI structure.

13. The device of claim 1, comprising a plurality of the LDMOS devices.

14. The device of claim 13, wherein a plurality of the gate electrodes of the LDMOS devices is connected to each other.

15. The device of claim 14, wherein the gate electrodes are connected to form a multi-finger shape.

* * * * *